United States Patent [19]

Ekström

[11] Patent Number: 5,617,629
[45] Date of Patent: Apr. 8, 1997

[54] PROCESS FOR PRODUCTION OF PRINTED CIRCUIT BOARDS AND USE THEREBY

[75] Inventor: Bernt Ekström, Tyringe, Sweden

[73] Assignee: Metfoils AB, Perstorp, Sweden

[21] Appl. No.: 424,378

[22] PCT Filed: Sep. 30, 1993

[86] PCT No.: PCT/SE93/00786

§ 371 Date: May 10, 1995

§ 102(e) Date: May 10, 1995

[87] PCT Pub. No.: WO94/12008

PCT Pub. Date: May 26, 1994

[30] Foreign Application Priority Data

Nov. 6, 1992 [SE] Sweden ................................. 9203327

[51] Int. Cl.$^6$ ..................................................... H05K 3/02
[52] U.S. Cl. ............................. 29/846; 156/150; 427/437
[58] Field of Search ............................. 29/846; 427/150, 427/437

[56] References Cited

U.S. PATENT DOCUMENTS

| Re. 29,820 | 10/1978 | Konicek. |
| 3,936,548 | 2/1976 | Konicek. |
| 3,990,926 | 11/1976 | Konicek. |
| 4,073,699 | 2/1978 | Hutkin. |
| 4,088,544 | 5/1978 | Hutkin. |
| 4,394,419 | 7/1983 | Konicek. |
| 4,401,521 | 8/1983 | Ohmura et al.. |
| 4,421,608 | 12/1983 | McBride. |
| 4,503,112 | 3/1985 | Konicek. |
| 4,715,116 | 12/1987 | Thorpe et al.. |
| 4,774,122 | 9/1988 | Adler. |
| 4,781,991 | 11/1988 | Thorpe et al.. |
| 5,049,434 | 9/1991 | Wasulko. |

FOREIGN PATENT DOCUMENTS 1458260  12/1976  United Kingdom.

*Primary Examiner*—Carl J. Arbes
*Attorney, Agent, or Firm*—Scully, Scott, Murphy & Presser

[57] ABSTRACT

The invention relates to a process for production of a copper clad, electrically insulated base for printed circuit boards, wherein a foil, of copper, copper alloy, aluminum or aluminum alloy by electroplating on preferably both sides furnished with a 1–35 μm thick unpatterned layer of copper or copper alloy, is under heat and pressure laminated with the copper surfaces facing an electrically insulating, resin containing base. The copper layers are electroplated onto the foil in such a way that the layers after lamination strongly adhere to the insulating base and at the same time exhibit a very poor adhesion to the foil, which easily can be stripped from the copper layers without splitting these. The foil works during the lamination as a mold plate, whereby conventional mold plates can be excluded. The invention also comprises the use of such a copper clad foil as a combined mold plate and base for the copper layers during the lamination.

14 Claims, No Drawings

PROCESS FOR PRODUCTION OF PRINTED CIRCUIT BOARDS AND USE THEREBY

The present invention relates to a process for the production of printed circuit boards and a use thereby.

Normally a printed wiring pattern is used for the production of printed circuit boards in the electronics industry. This technique means the use of so called printed circuits, which usually are manufactured using a copper clad plastic laminate as starting material. A copy of the wiring pattern is transferred to the copper layer by e.g. printing or by a photochemical process. The applied pattern, the so called etch resist, acts as a protection during the subsequent removal by etching of superfluous copper. The electronic components are thereafter mounted on the laminate holding the finished wiring pattern and a complete printed circuit board of the most plain kind is thus obtained. The copper conductors provide the necessary electrical connections and the laminate provides mechanical support. The possibilities of a space and weight saving build up of the electronic unit are good. The method gives a high reliability and a rational production.

The most common bases are paper reinforced phenolic laminates which are used for rather plain circuits and glass cloth reinforced epoxy resin laminates which are used when the technical requirements are high. Other types of fibre reinforced laminates are also used. Base materials of the type plastic films and plastic coated metal plates are, furthermore, used to a certain extent.

It is common when preparing the copper coating to use copper foils, which are placed on a base forming fibre impregnated material impregnated with a partially cured resin (so called prepreg), followed by moulding at high pressure and elevated temperature. The final curing of the resin is hereby effected and the fibre material is compressed to a sheet to which also the copper foil is bonded. The copper foil usually has a thickness of 35 µm, but thicker or thinner foils also exist. A further common process is the gluing of a copper foil onto a plastic film using heat and pressure.

Due to the rapid development in the field of electronics, the need for printed circuits with good dimensional precision especially in circuitry with a small line width and a space between the conductors, is increasing. Presently printed circuits with a line width of 0.1–0.2 mm and with an equally small conductor space are already required. Dimensions that are yet smaller will be required in the future. This development has led to a demand for laminates with thinner copper layers. During the last years laminates with a copper foil thickness of 6–12 µm have increasingly come into use. By using a thinner copper foil advantages, such as a reduced so called "undercut", are obtained. Undercut is understood as the removal of copper underneath the etch resist caused by the etch solution which while dissolving the unprotected parts of the copper layer also eats into the copper covered by the etch resist. Undercut is a difficult problem causing an unacceptably low dimensional precision especially at small line widths. The effect of undercut on small conductor widths will below be further explained. It is by means of an accurate technique possible to obtain a high precision in the application of the etch resist itself.

However, owing to the undercut, difficulties arise in maintaining the good dimensional precision of e.g. the line widths and conductor spaces, which the technique of masking with an etch resist per se makes possible.

It is not solely with small line widths and small conductor spaces that a thinner copper layer is of advantage. Thinner copper layers result in an improved dimensional precision also with larger line widths and conductor spaces, which is an advantage, e.g. in those cases in which the electrical influence between the conductors must be considered when building up the electronic construction. These demands are expected to increase in the future i.a. in electronic systems operating at high frequences.

Further advantages by using thinner copper layers are that the etching time is considerably reduced and that the amount of etching solution consumed is lesser. The consumption of copper is likewise reduced when using thinner copper layers. From the latter reasons thin copper layers may prove to be an advantage also at less high demands for dimensional precision.

The thickness can, if an increased thickness of the copper of the conductors is desired, be increased by chemical deposition or by electro-deposition of copper according to known processes. This means that copper is employed only on that part of the finished printed circuit which is covered by metal, which in most cases is a minor portion of the total surface of the circuit. The increase of the copper thickness of the conductors can when using a suitable technique be performed with a good dimensional precision and can in the case of insulation bases, which on both sides are furnished with a wiring pattern of copper, suitably be carried out in connection with the so called through holes plating, which provides electrical connections between the printed circuits of the two sides of the base as well as holes for mounting of electrical components. Any additional processing stage involving plating of the through holes is in this case not required. The main portion of the conductors and the plating of the through holes will constitute a homogeneous and simultaneously deposited metal, which is an advantage with regard to reliability.

Besides above described comparatively simple printed circuit boards with a wiring pattern on one or two sides, so-called multilayer printed circuit boards are available on the market.

These multilayer printed circuit boards are composed of several so called inner layers, each consisting of an insulating base of a thin laminate of a thermosetting resin impregnated reinforcement material with a layer of metal or metal alloy on preferably both sides, in which layers a wiring pattern has been formed, and so called prepreg sheets of reinforcement material impregnated with a thermosetting resin, whereby the resin is not fully cured, which prepreg sheets are placed between the inner layers.

Multilayer printed circuit boards are used for advanced electronic purposes and are often composed of two or more inner layers of the above kind with intermediate prepreg sheets. Moreover an outer layer consisting of a laminate of the above kind having a thin layer of metal or metal alloy on one side is placed on each side of the stack of inner layers. The metal layer is directed outwards. In certain cases the outer layers are composed of a thin foil of metal or metal alloy instead of said laminate. Prepreg sheets are also placed between the utmost of the inner layers and the outer layers.

A process for production of printed circuit boards having thin copper layers is disclosed in the Swedish patent 7110929-2. In this case a temporary base of e.g. aluminium is used onto which a thin continuous copper layer is electroplated. The copper layer of the temporary base faces an insulating base and is laminated to this under heat and pressure. The temporary base is, subsequent to the lamination removed by means of etching or by mechanical stripping. Several copper clad laminates or multilayer boards are during this process, as well as during other processes disclosed above, moulded simultaneously. Mould plates are, in order to render the produced laminates a sufficient quality with regard to surface smoothness and cleanliness, placed between these various so-called lamination stacks. Above mould plates are most often made of steel with a thickness of at least 1.5 mm. Prior to each mould the mould plates must be carefully polished and cleaned in order to be able to keep the amount of discarded products at a low level.

The unavoidable dust present in the factory premises also contribute to big discard problems.

The handling of mould plates is expensive and difficult but has for decades been regarded as necessary.

It has according to the present invention been possible to avoid above difficult and expensive use of conventional mould plates. The invention relates to a process for production of a copper or copper alloy clad, electrically insulated base for printed circuit boards. A foil of copper, copper alloy, aluminium or aluminium alloy, by electro-plating on one or preferably both sides furnished with a 1–35 μm, preferably 1–18 μm, thick unpatterned layer of copper or copper alloy, is under heat and pressure laminated with the copper surfaces facing an electrically insulating, resin containing base. The copper layers are electroplated onto the foil in such a way that the layers after lamination strongly adhere to the insulating base and at the same time exhibit a very poor adhesion or to an intermediate adhesion reducing layer to the foil, which foil with possible adhesion reducing layer easily can be separated from the copper layers without splitting these. The invention is characterised in, that the foil during the lamination works as a mould plate, whereby conventional mould plates can be excluded.

A new foil of a disposable type is throughout the invention used, onto which a layer of copper is electroplated. All cleansing and dusting problems as above when using conventional steel plates are thus avoided. Aluminium and copper are better heat conductors than steel and this results in a more uniform and improved quality of the produced copper laminate, i.a. due to a more uniform degree of curing of the thermosetting resin. According to the invention a laminate with a very even copper surface is obtained. This depends on the fact that the electroplated copper layer at the laminating step is attached to a rather thick and soft foil of aluminium or copper. Therefore, the structure of the glass fibre cloth situated underneath will not be transferred to the copper surface. This makes it possible to use a glass fibre cloth which is coarser than usually utilised in this connection. The coarser cloth gives a laminate with better dimensional stability than a thinner cloth. In addition the coarser cloth is cheaper.

The foil of copper, copper alloy, aluminium or aluminium alloy is suitably of a thickness of 50–600 μm, preferably 100–400 μm and most preferably 150–400 μm. As disclosed above ordinary mould plates of steel normally exhibit a thickness of about 1.5 mm. According to the invention the capacity of the press hence increases, due to a reduction of space occupied by mould plates. The time consumed by the mould cycle can, furthermore, be reduced due to the higher heat conductivity of aluminium and copper compared to steel.

The resin containing, insulating base can consist of many different materials, i.a. of glass fibre cloth impregnated with epoxy resin or polyimide or of paper impregnated with phenol-formaldehyde resin.

Several different processes can be used in order to obtain the, according to the invention, necessary poor adhesion between the copper or aluminium foil and the copper layers after the lamination step. The foil can i.a. be furnished with an adhesion reducing coating of oxide such as aluminium oxide. Such a process is disclosed in the Swedish patent 7405449-5.

According to another method a chromium layer is electroplated onto the foil. If an aluminium foil is used, it is suitable to electroplate a 0.1–10 μm, preferably 0.1–5 μm thick layer of copper or copper alloy on the foil followed by a 0.01–1.5 μm, preferably 0.05–1.0 μm thick electroplated chomium layer and then the above-mentioned 1–35 μm, preferably 1–18 μm thick layer of copper or copper alloy.

If instead a foil of copper or copper alloy is used it is suitable to electroplate a 0.01–1.5 μm, preferably 0.05–1.0 μm thick chromium layer on the foil followed by the above-mentioned 1–35 μm, preferably 1–18 μm thick layer of copper or copper alloy.

Regardless of whether a copper or aluminium foil is used it is suitable to provide the foil with a surface magnifying layer by electroplating before the application of the chromium layer. Preferably the surface magnifying layer consists of copper or copper alloy.

Another method to obtain a poor adhesion is described in the U.S. Pat. No. 3,969,199. The foil is according to this method treated with an alkaline aqueous solution containing alkaline metal zincate, a water soluble salt of iron, cobalt or nickel and a complexing agent. The foil is then treated with an acid in order to remove the applied coating. Copper is thereafter electroplated onto the foil.

A further method to obtain a poor adhesion is a currentless treatment of the foil at 30°–95° C., preferably 50°–75° C., in an aqueous solution of copper pyrophosphate. Electroplating of copper is then performed, e.g. in the same solution, at the same temperature and at a current density of 3–8 A/dm$^2$.

In example 1 of the U.S. Pat. No. Re. 29,820 a process is also disclosed by which said poor adhesion is obtained.

Regardless of which process according to above that is used to obtain the poor adhesion, the subsequent electroplating of copper can be performed in one or more steps using the same or a different current density. The various copper plating baths can be of several different compositions. The electro-plating is suitably performed in such a way that a surface magnifying, dendrite resembling surface layer is obtained, which after the lamination provides a good adhesion to the insulating base. The surface magnifying layer is then normally furnished with a barrier layer. This can be applied by e.g. electro-plating or by chemical processes. The barrier layer can i.a. consist of zinc and is intended to passivate the copper surface.

The process according to the invention is especially suitable for production of so-called multilayer printed circuit boards. A foil of copper, copper alloy, aluminium or aluminium alloy, on both sides plated with copper or copper alloy, is then placed between as well as on top of a mould stack consisting of several inner layers of plastic laminate, on both sides furnished with a wiring pattern of copper or copper alloy, and so-called prepreg sheets placed between the inner layers as well as between the outside of the utmost inner layer of each stack and the copper clad aluminium foil. The prepreg sheets consist preferably of glass fibre cloth impregnated with a partially cured epoxy resin or the like. A stack of a number of such mould stacks is moulded under heat and pressure without ordinary mould plates. After the moulding the mould stack is separated along the foils of copper, copper alloy, aluminium or aluminium alloy or along an intermediate adhesion reducing layer applied to the foils. The uncovered copper surface on the two outsides of obtained multilayer board can then in the usual way be furnished with wiring patterns.

The used foil is returned to the manufacturer where it is employed in the production of new foils. The process according to the invention is, hence, favourable also from an environmental and economical point of view.

The invention also comprises a use of a foil of copper, copper alloy, aluminium or aluminium alloy, with a thickness of 50–600 μm, preferably 100–400 μm and most preferably 150–400 μm, which by electroplating on one or preferably both sides is furnished with a 1–35 μm, preferably 1–18 μm thick layer of copper or copper layers during moulding of copper clad laminates for production of printed circuit boards. The copper layers are electro-plated onto the foil in such a way that these after moulding exhibit such a poor adhesion to the foil or to an adhesion reducing layer applied to the foil that the foil with a possible adhesion reducing layer easily can be separated from the copper layers.

The invention is further illustrated by the enclosed embodiment examples of which example 1 shows the production of copper clad laminates by means of copper clad aluminium foils according to one embodiment of the invention without using conventional mould plates. Example 2 illustrates the same process as example 1. However, here copper clad copper foils were used.

EXAMPLE 1

An aluminium foil with a thickness of 200 μm was etched for 30 seconds at a temperature of 40° C. in an aqueous solution containing

| NaOH | 30 g/l |
|---|---|
| Rochelle salt | 46 g/l |
| Sodium carbonate | 46 g/l |

Then the foil was rinsed in deionized water.

In a subsequent step the foil was zincated in the following aqueous solution

| NaOH | 50 g/l |
|---|---|
| Zinc oxide | 5 g/l |
| Rochelle salt | 50 g/l |
| Sodium nitrate | 1 g/l |
| Iron chloride | 2 g/l | at a temperature of 40° C.

The foil was then rinsed again in deionized water followed by an electroplating step where an aqueous solution containing

| potassium pyrophosphate | 290 g/l |
|---|---|
| copper pyrophoshate | 50 g/l | was used.

The pH of the solution was 8.5. The current density was 5 A/dm$^2$ and the electroplating lasted 20 seconds.

The foil was cleaned in deionized water.

The foil was then provided with a rough surface structure (nodularized) by treatment for 20 seconds in an aqueous solution containing

| copper sulfate calculated as metallic copper | 7 g/l |
|---|---|
| H$_2$SO$_4$ | 80 g/l | at a temperature of 28° C. and a current density of 5 A/dm$^2$.

On top of this rough copper surface another sealing copper layer was applied by means of an aqueous solution containing

| copper sulfate calculated as metallic copper | 65 g/l |
|---|---|
| H$_2$SO$_4$ | 70 g/l |

The temperature was 28° C. and the current density was 25 A/dm$^2$. The electroplating lasted 40 seconds. The total copper thickness obtained so far including the rough surface layer was about 2.5 μm.

The foil was then provided with a chromate layer by electroplating for 20 seconds in an aqueous solution containing

| chromic acid calculated as CrO$_3$ | 30 g/l |
|---|---|
| H$_2$SO$_4$ | 0.3 g/l |

The temperature was 30° C. and the current density was 20 A/dm$^2$.

The foil was then electroplated by means of an aqueous solution containing

| potassium pyrophosphate | 290 g/l |
|---|---|
| copper pyrophosphate | 50 g/l |

The pH was 8.5. The current density was 5 A/dm$^2$ and the electroplating lasted 20 seconds.

The foil was then electroplated for 60 seconds in an aqueous solution containing

| copper sulfate calculated as metallic copper | 65 g/l |
|---|---|
| H$_2$SO$_4$ | 70 g/l |

The temperature was 28° C. and the current density was 35 A/dm$^2$. The thickness of the copper layer obtained was 7 μm.

The foil was then electroplated for 30 seconds in an aqueous solution containing

| copper sulfate calculated as metallic copper | 7 g/l |
|---|---|
| H$_2$SO$_4$ | 80 g/l |

The temperature of the solution was 30° C. and the current density was 10 A/dm$^2$. At this step a rough copper surface was obtained.

The foil was then electroplated in an aqueous solution containing

| copper sulfate calculated as metallic copper | 65 g/l |
|---|---|
| H$_2$SO$_4$ | 70 g/l |

The temperature was 28° C. and the current density was

The foil was then provided with a copper passivating layer by known methods.

By the above method an aluminium foil on both sides provided with a releasable copper layer with a thickness of about 9 micron was obtained.

In a conventional press the following sheets were stacked on top of each other;

one copper coated aluminium foil obtained according to the above method, five sheets of prepreg consisting of glass fabric, style 7628 impregnated with epoxy resin, another copper coated aluminium foil, five prepreg sheets of the above kind and another copper coated aluminium foil.

The above stack was pressed for 1.5 hours at 180° C. and a pressure of 35 kp/cm² without conventional press plates. Two laminates on both sides provided with a strongly adhering copper layer was obtained when the laminated product produced was easily separated. In spite of the rather thin press plate (the aluminium foil) and the rather coarse glass fabric used the copper surface of the laminates obtained had a roughness, $R_Z$ of 3,5 µm and $R_A$ of 0.5 µm. These are extremely good values.

EXAMPLE 2

A copper foil with a thickness of 200 µm was carefully cleaned.

The foil was then provided with a rough surface structure (nodularized) by treatment for 20 seconds in an aqueous solution containing

| copper sulfate calculated as metallic copper | 7 g/l |
|---|---|
| $H_2SO_4$ | 80 g/l | at a temperature of 28° C. and a current density of 5 A/dm².

On top of this rough copper surface another sealing copper layer was applied by means of an aqueous solution containing

| copper sulfate calculated as metallic copper | 65 g/l |
|---|---|
| $H_2SO_4$ | 70 g/l |

The temperature was 28° C. and the current density was 25 A/dm². The electroplating lasted 40 seconds. The total copper thickness obtained so far including the rough surface layer was about 2.5 µm.

The foil was than provided with a chromate layer by electroplating for 20 seconds in an aqueous solution containing

| chromic acid calculated as $CrO_3$ | 30 g/l |
|---|---|
| $H_2SO_4$ | 0.3 g/l |

The temperature was 30° C. and the current density was 20 A/dm².

The foil was then electroplated by means of an aqueous solution containing

| potassium pyrophosphate | 290 g/l |
|---|---|
| copper pyrophosphate | 50 g/l |

The pH was 8.5. The current density was 5 A/dm² and the electroplating lasted 20 seconds.

The foil was then electroplated for 60 seconds in an aqueous solution containing

| copper sulfate calculated as metallic copper | 65 g/l |
|---|---|
| $H_2SO_4$ | 70 g/l |

The temperature was 28° C. and the current density was 35 A/dm². The thickness of the copper layer obtained was 7 µm.

The foil was then electroplated for 30 seconds in an aqueous solution containing

| copper sulfate calculated as metallic copper | 7 g/l |
|---|---|
| $H_2SO_4$ | 80 g/l |

The temperature of the solution was 30° C. and the current density was 10 A/dm². At this step a rough copper surface was obtained.

The foil was then electroplated in an aqueous solution containing

| copper sulfate calculated as metallic copper | 65 g/l |
|---|---|
| $H_2SO_4$ | 70 g/l |

The temperature was 28° C. and the current density was 35 A/dm².

The foil was then provided with a copper passivating layer by known methods.

By the above method an aluminium foil on both sides provided with a releasable copper layer with a thickness of about 9 µm was obtained.

In a conventional press the following sheets were stacked on top of each other; on copper coated aluminium foil obtained according to the above method, five sheets of prepreg consisting of glass fabric, style 7628 impregnated with epoxy resin, another copper coated aluminium foil, five prepreg sheets of the above kind and another copper coated aluminium foil.

The above stack was pressed for 1.5 hours at 180° C. and a pressure of 35 kp/cm². Without conventional press plates. Two laminates on both sides provided with a strongly adhering copper layer was obtained when the laminated product produced was easily separated. In spite of the rather thin press plate (the copper foil) and the rather coarse glass fabric used the copper surface of the laminates obtained had a roghness, $R_Z$ of 3,8 µm and $R_A$ of 0.5 µm. These are extremely good values.

I claim:

1. In a process for the production of an electrically insulated base clad for use in manufacturing printed circuit boards comprising laminating, under heat and pressure, a foil selected from the group consisting of copper, copper alloy, aluminum and aluminum alloy, which includes an unpatterned electroplated layer having a thickness of 1–35 µm on both sides of said foil, said electroplated layer being copper or a copper alloy, to an electrically insulating base containing a resin, said foil disposed such that said electroplated surface faces said base, wherein said lamination occurs in the absence of any molding plates and wherein said electroplated layer, after lamination, adheres to the insulating base but not to the foil permitting separation of the foil from said electroplated layer.

2. The process according to claim 1 wherein said electroplated layer has a thickness of 1–18 µm.

3. The process according to claim 1 wherein said foil includes an intermediate adhesion layer.

4. The process according to claim 1 wherein said insulating base is selected from the group consisting of a glass fiber cloth impregnated with an epoxy resin or a polyimide and paper impregnated with a phenol-formaldehyde resin.

5. The process according to claim 1 wherein said foil has a thickness of 50–600 µm.

6. The process according to claim 5 wherein said foil has a thickness of 100–400 µm.

7. The process according to claim 3 wherein said intermediate adhesion reducing layer is chromium or aluminum oxide.

8. The process according to claim 7 wherein said foil is copper or copper alloy, said intermediate adhesion layer is 0.01–1.5 μm thick.

9. The process according to claim 7 wherein said foil includes a surface magnifying electroplated layer applied before said intermediate adhesion layer.

10. The process according to claim 9 wherein said surface magnifying electroplated layer is copper or a copper alloy.

11. The process according to claim 1 wherein said foil is aluminum or aluminum alloy and is currentlessly treated in an aqueous solution containing copper pyrophosphate at a temperature of from 30° C. to 95° C. and then electroplated with copper in the same solution using a current density of from 3 to 8 A/dm$^2$.

12. The process according to claim 1 wherein said electroplated layer includes a magnifying, dendrite resembling surface layer which, after said lamination step, provides adhesion to said insulating base.

13. The process according to claim 12 wherein said surface magnifying layer further includes a barrier layer to passivate said copper surface.

14. A process for the production of multilayer printed circuit board comprising:

placing foil selected from the group consisting of copper, copper alloy, aluminum and aluminum alloy, electroplated on both sides with a layer of copper or copper alloy, between and on top of a stack of sheets, and sheets comprising several inner layers of a plastic laminate, said plastic laminate furnished with wiring patterns of copper or a copper alloy on both of its sides;

positioning prepeg sheets between said inner layers and between the outside of the outermost layer in each stack and said foil, said prepeg sheet consisting of a glass fiber cloth impregnated with a partially cured epoxy resin or a polyimide;

molding said stack of sheets under heat and pressure, in the absence of molding plates; and separating said stack of sheets along said foils.

* * * * *

UNITED STATES PATENT AND TRADEMARK OFFICE
CERTIFICATE OF CORRECTION

PATENT NO. : 5,617,629
DATED : April 8, 1997
INVENTOR(S) : Bernt Ekstrom

It is certified that error appears in the above-indentified patent and that said Letters Patent is hereby corrected as shown below:

Column 8, line 42, Claim 1: "in a" should read --A--

Column 8, line 59, Claim 3: "adhesion layer." should read --adhesion reducing layer.--

Signed and Sealed this

Seventeenth Day of February, 1998

Attest:

BRUCE LEHMAN

Attesting Officer

Commissioner of Patents and Trademarks